United States Patent
Ayotte et al.

(10) Patent No.: US 10,605,850 B2
(45) Date of Patent: Mar. 31, 2020

(54) SCREENING METHODOLOGY TO ELIMINATE WIRE SWEEP IN BOND AND ASSEMBLY MODULE PACKAGING

(71) Applicant: International Business Machines Corporation, Armonk, NY (US)

(72) Inventors: Stephen Peter Ayotte, Essex Junction, VT (US); Michael Russell Uy Gonzales, Quezon Province (PH); Mark Tiam Weng Lam, Singapore (SG)

(73) Assignee: International Business Machines Corporation, Armonk, NY (US)

( * ) Notice: Subject to any disclaimer, the term of this patent is extended or adjusted under 35 U.S.C. 154(b) by 240 days.

(21) Appl. No.: 15/278,373

(22) Filed: Sep. 28, 2016

(65) Prior Publication Data

US 2017/0016950 A1   Jan. 19, 2017

Related U.S. Application Data

(63) Continuation of application No. 13/834,039, filed on Mar. 15, 2013, now Pat. No. 9,470,740.

(51) Int. Cl.
 *G01R 31/04* (2006.01)
 *G01R 31/02* (2006.01)
 (Continued)

(52) U.S. Cl.
 CPC ......... *G01R 31/041* (2013.01); *G01R 31/025* (2013.01); *G01R 31/048* (2013.01); *G01R 31/2896* (2013.01); *H01L 24/78* (2013.01); *H01L 24/85* (2013.01); *H01L 2224/78901* (2013.01); *H01L 2224/859* (2013.01); *H01L 2924/00014* (2013.01); *H01L 2924/3862* (2013.01)

(58) Field of Classification Search
 CPC ................ G01R 31/041; G01R 31/048; G01R 31/2896; G01R 31/025; G01R 31/2894; G01R 31/287; G01R 31/01; G01R 31/12; H01L 2924/00014; H01L 2924/3862; H01L 2224/78901; H01L 24/85; H01L 24/78; H01L 2224/859; G01N 23/04
 See application file for complete search history.

(56) References Cited

U.S. PATENT DOCUMENTS

| | | |
|---|---|---|
| 5,721,496 A | 2/1998 | Farnworth et al. |
| 6,272,204 B1 | 8/2001 | Amtower et al. |
| (Continued) | | |

OTHER PUBLICATIONS

Pendse et al., Radially Staggered Bonding Technology, Hewlett-Packard Journal, Dec. 1996.

*Primary Examiner* — Lee E Rodak
(74) *Attorney, Agent, or Firm* — Lieberman & Brandsdorfer, LLC

(57) ABSTRACT

Quality control testing for a batch of electronic modules. A series of tests are performed on manufactured electronic modules, including tests sensitive to the failure rate of previously tested modules. Specifically, a first test comprised of two phases is performed on the module batch. Further screening is then performed responsive to detection of a wire sweep failure in a subset of failed modules from the first test phase. The further screening is on modules that passed the first test phase and excludes modules that failed the first test phase.

20 Claims, 4 Drawing Sheets

(51) Int. Cl.
*G01R 31/28* (2006.01)
*H01L 23/00* (2006.01)

(56) References Cited

U.S. PATENT DOCUMENTS

| | | |
|---|---|---|
| 6,553,546 B1 * | 4/2003 | Murakami ............ G01R 31/311 |
| | | 324/501 |
| 6,574,760 B1 | 6/2003 | Mydill |
| 7,120,513 B1 | 10/2006 | Akram et al. |
| 7,432,588 B2 | 10/2008 | Kimura |
| 2003/0062913 A1 * | 4/2003 | Cirkel .................... G01R 31/01 |
| | | 324/762.02 |
| 2006/0085715 A1 * | 4/2006 | Kim ................. G01R 31/31723 |
| | | 714/742 |
| 2009/0237104 A1 | 9/2009 | Tsuchida et al. |

* cited by examiner

SCREENING METHODOLOGY TO ELIMINATE WIRE SWEEP IN BOND AND ASSEMBLY MODULE PACKAGING

CROSS-REFERENCE TO RELATED APPLICATION(S)

This application is a continuation of U.S. patent application Ser. No. 13/834,039, filed on Mar. 15, 2013 and titled "Screening Methodology To Eliminate Wire Sweep In Bond And Assembly Module Packaging," now pending, which is hereby incorporated by reference.

BACKGROUND

Technical Field

The present embodiments relates generally to electronic module testing. More specifically, the embodiments relates to a process for efficient testing of the modules for a wire sweep.

Background

In bond and assembly of an electronic package or module, wires are bonded to a die and finger on a laminate. These wires serve to connect the die to the outer laminate, enabling the function of the module at an associated card attachment location.

Electronic modules however, may be defective as a result of a variety of manufacturing defects. One such defect is known as a wire sweep, wherein the wires of the module are not properly aligned. Misalignment of the wires may cause a short and may be detectable prior to the short. While testing for wires that are in physical contact is somewhat rudimentary, wires that are close together, yet not in contact, do not fail this shorting test and are therefore more difficult to detect. One solution is to use an x-ray to detect a wire sweep. However, this process is expensive, making the X-ray screening of many modules undesirable.

SUMMARY

The embodiments include a method, system, and computer program product for efficiently testing electronic modules for a defect.

In one aspect, a method is provided for performing a quality control review of electronic modules. Individual modules include a functional assembly of electrical components. A first test is performed on a first batch of modules to detect a gross failure associated with the modules. Similarly, a second test is performed on failed modules of the first test. The second test is an electromagnetic imaging test of one or more wires in the electronic module. A third test is performed on modules that pass the second test. The third test comprising is an electronic current leakage screening.

In another aspect, a computer program product is provided to perform quality review of electronic modules. The computer program product is in communication with a computer-readable hardware storage device having computer readable program code embodied therewith. When executed, the computer implements testing on the electronic modules. First, second, and third tests are performed. More specifically, the first test is performed on a first batch of the modules to detect a gross failure. The second test is performed on failed modules of the first test, with the second test being an electromagnetic imaging test. The third test is performed on modules that pass the second test, with the third test being an electronic current leakage screening.

In yet another aspect, a system is provided to perform quality control review on one or more electronic modules. The system includes a processing unit provided in communication with memory. One or more tools are provided to perform a quality control review of the electronic modules in a batch, with each module being a functional assembly of electronic components. A test manager and a screening manager are provided. The test manager performs a first test and a second test. The first test is performed on a first batch of the modules, and functions to detect a gross failure associated with the modules. The second test is performed on failed modules of the first test. The second test is an electromagnetic image test on one or more wires in the electronic module(s). Finally, a third test is performed by the screening manager for modules that pass the second test. The third test is in the form of an electronic current leakage screening.

Other features and advantages of these embodiments will become apparent from the following detailed description of the presently preferred embodiments, taken in conjunction with the accompanying drawings.

BRIEF DESCRIPTION OF THE DRAWINGS

The drawings referenced herein form a part of the specification. Features shown in the drawings are meant as illustrative of only some embodiments, and not of all embodiments unless otherwise explicitly indicated. Implications to the contrary are otherwise not to be made.

DETAILED DESCRIPTION

Figure 1:
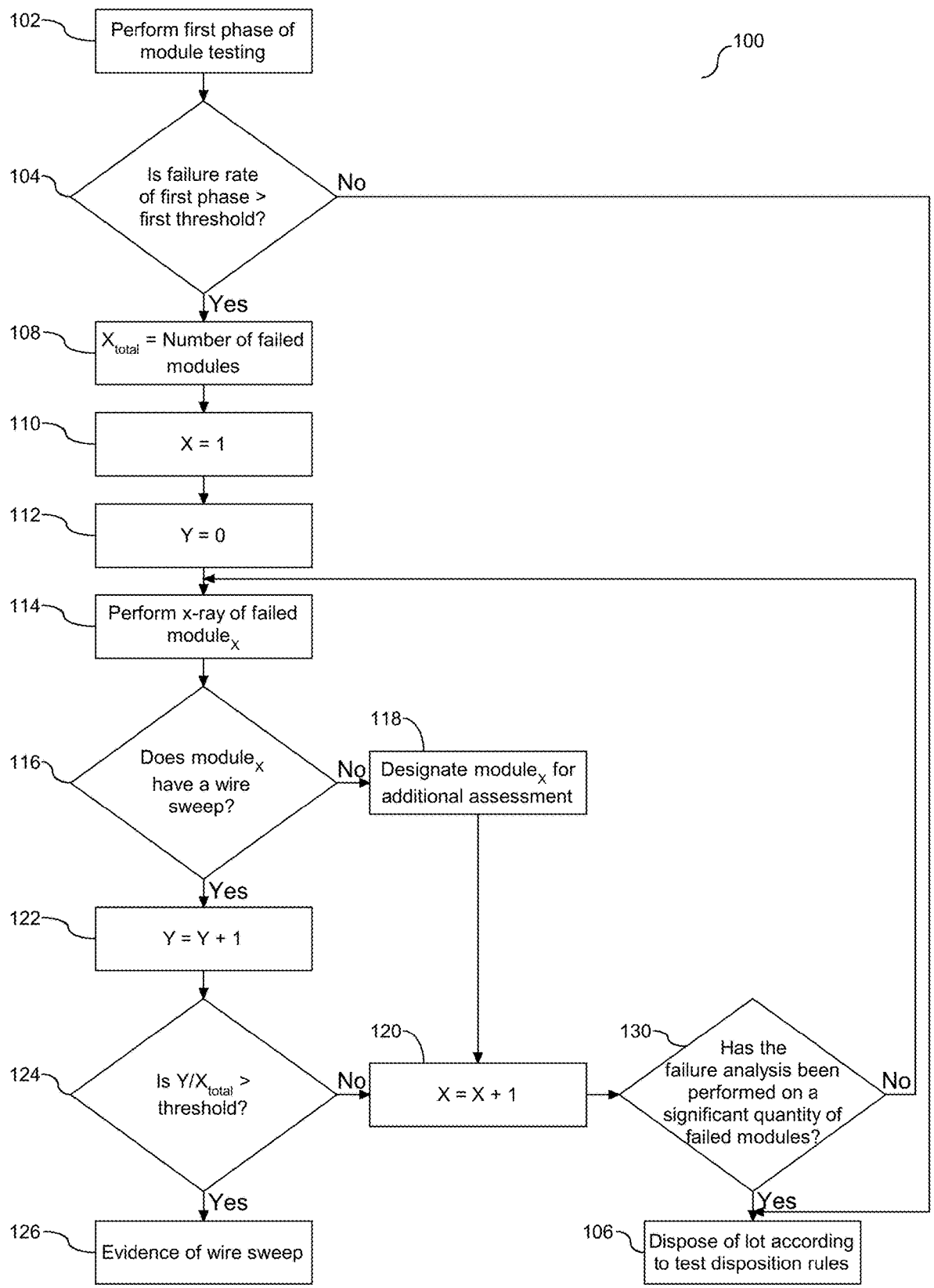
FIG. 1 is a flow chart illustrating a method for a first and second phase of a first module test.

It will be readily understood that the components of the present embodiments, as generally described and illustrated in the Figures herein, may be arranged and designed in a wide variety of different configurations. Thus, the following detailed description of the embodiments of the apparatus, system, and method of the present embodiments, as presented in the Figures, is not intended to limit the scope of the embodiments, as claimed, but is merely representative of selected embodiments.

The functional unit described in this specification has been labeled with tools, modules, and/or managers. The functional unit may be implemented in programmable hardware devices such as field programmable gate arrays, programmable array logic, programmable logic devices, or the like. The functional unit may also be implemented in software for execution by various types of processors. An identified functional unit of executable code may, for instance, comprise one or more physical or logical blocks of computer instructions which may, for instance, be organized as an object, procedure, function, or other construct. Nevertheless, the executable of an identified functional unit need not be physically located together, but may comprise disparate instructions stored in different locations which, when joined logically together, comprise the functional unit and achieve the stated purpose of the functional unit.

Indeed, a functional unit of executable code could be a single instruction, or many instructions, and may even be distributed over several different code segments, among different applications, and across several memory devices. Similarly, operational data may be identified and illustrated herein within the functional unit, and may be embodied in any suitable form and organized within any suitable type of data structure. The operational data may be collected as a single data set, or may be distributed over different locations including over different storage devices, and may exist, at least partially, as electronic signals on a system or network.

Reference throughout this specification to "a select embodiment," "one embodiment," or "an embodiment" means that a particular feature, structure, or characteristic described in connection with the embodiment is included in at least one embodiment of the present embodiments. Thus, appearances of the phrases "a select embodiment," "in one embodiment," or "in an embodiment" in various places throughout this specification are not necessarily referring to the same embodiment.

Furthermore, the described features, structures, or characteristics may be combined in any suitable manner in one or more embodiments. In the following description, numerous specific details are provided, such as examples of managers, to provide a thorough understanding of embodiments. One skilled in the relevant art will recognize, however, that the embodiments can be practiced without one or more of the specific details, or with other methods, components, materials, etc. In other instances, well-known structures, materials, or operations are not shown or described in detail to avoid obscuring aspects of the embodiments.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

In the following description of the embodiments, reference is made to the accompanying drawings that form a part hereof, and which shows by way of illustration the specific embodiment(s) which may be practiced. It is to be understood that other embodiments may be utilized because structural changes may be made without departing from the scope of the present embodiments.

In order to maximize efficiency of module testing, multiple tests may be employed, in which further assessments are reserved for a smaller batch of modules for improved testing efficiency. FIG. 1 is a flow chart (100) illustrating a method for a first set of testing that employs at least two such tests for assessing the modules. Initially, a first test of module testing is employed on a batch of modules (102). This first test, also referred to as a first phase, is employed to detect a gross failure associated with modules within the batch. A failure rate is determined from the first test, and it is determined if this failure rate is greater than a first threshold (104). A negative response is an indication the batch, or a significant portion of the modules in the batch has passed the first test in the assessment and in one embodiment, the batch is designated for shipment (106). Accordingly, the first test determines an initial disposition lot.

A positive response to the determination at step (104) is an indication that there is a detected defect within at least some of the tested module(s) of the batch. In one embodiment, the detected defect is an indication of a high occurrence of a short or shorting defect in the batch. This detection is an indication that it might be a wire sweep since there is the indication of a possible shorting defect in the batch. The number of failed modules is assigned to the variable, $X_{total}$ (108). In addition, a counting variable x is initialized for the failed modules (110), and a counting variable y is initialized to count modules (112). A second test in the form of an x-ray wire sweep is performed on failed module (114). From this testing, it is determined if the module has a wire sweep deficiency (116). In one embodiment, the wire sweep is a misalignment of one or more wires in an electronic module. A negative response to step (116) is followed by designating the module, module for an additional assessment (118) followed by incrementing the variable x (120). Any module determined to have failed the first test but does not have evidence of a wire sweep is indicative of a different problem that requires further failure analysis. Conversely, a positive response to the determination at step (116) is followed by an increment of the variable y (122). For each module determined to have a wire sweep deficiency, it is determined if the percentage of modules with wire sweeps is greater than a defined threshold (124). The threshold analysis at step (124) provides an indicator on which modules to carry out additional analysis. A positive response is followed by evidence of a wire sweep in the failed lot of the first testing phase (126). Conversely, a negative response to the determination at step (124) is followed by an increment of the module counting variable, x, (120) and determining if a detailed failure analysis has been performed on a large or significant quantity of failed modules for the failed lot of the first test (130). In one embodiment, the determination at step (130) is subjective. A negative response to the determination at step (130) is followed by a return to step (114), and a positive response is followed by a return to step (106).

Figure 2:
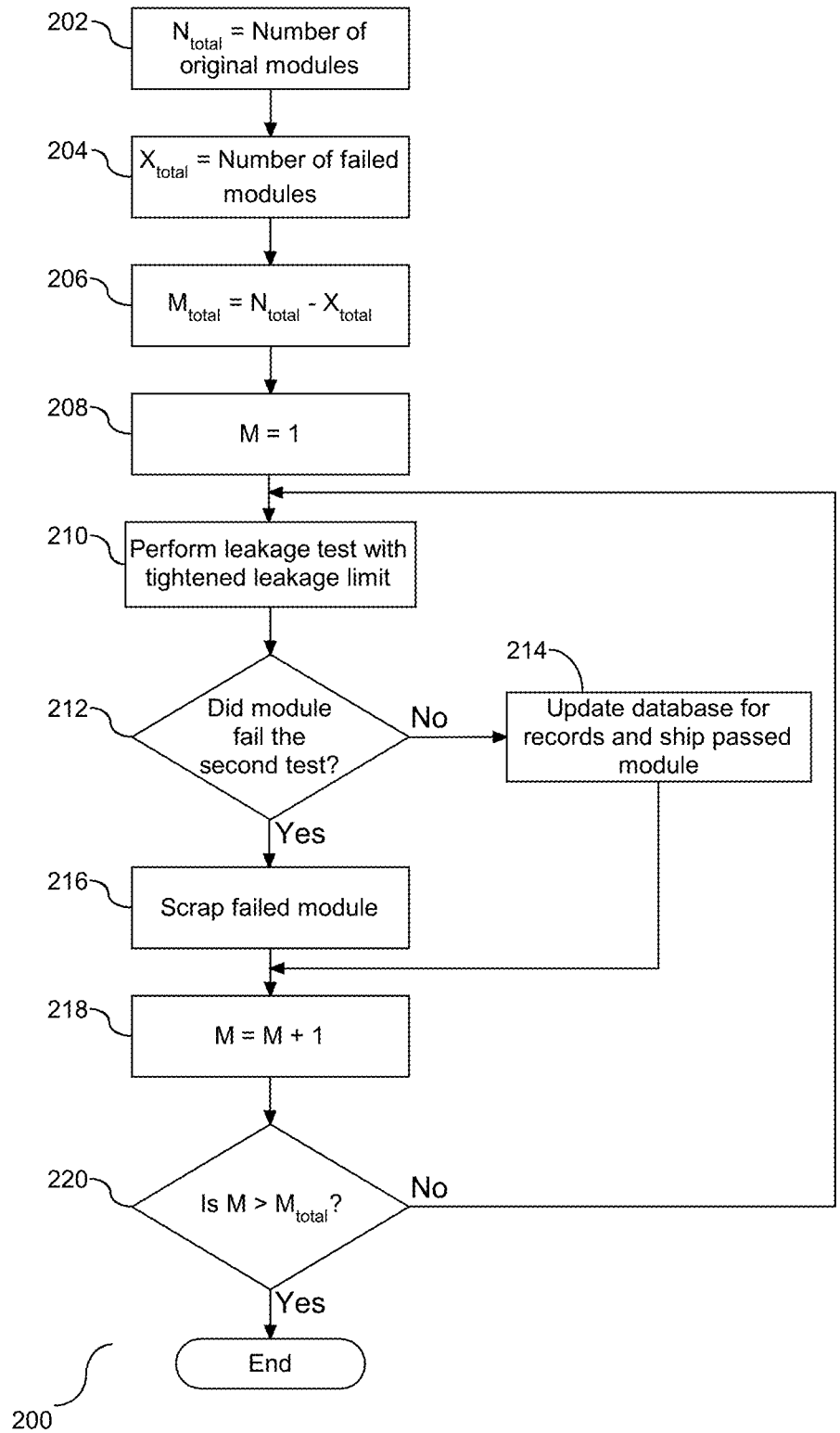
FIG. 2 is a flow chart illustrating a method for a second module test.

A second set of testing is limited to modules that have passed the first set of testing. FIG. 2 is a flow chart (200) illustrating a method for the second set of testing which pertains to assessing current leakage in the individual modules. This second set of testing, like the first set of testing, includes two parts. The variable $N_{Total}$ is assigned to the number of original modules in the batch (202) and the variable $X_{Total}$ is assigned to the number of failed modules from the first set of testing (204). The variable $M_{Total}$ is defined as the difference between $N_{Total}$ and $X_{Total}$ (206). The counting variable M is initialized (208), and a current leakage test is performed on module$_M$ at a first leakage limit (210). Accordingly, each module$_M$ is tested for current leakage up to a specified current leakage limit.

Following the current leakage test at step (210), it is determined whether the module, module$_M$, failed the current leakage limit test (212). A negative response is followed by updating the database records of the results and designating the passed module for shipment (214). Conversely, a positive response to the determination at step (212) designates the failed module to be scrapped or otherwise disposed (216). Following either step (214) or (216), the counting variable M is incremented for testing of additional modules (218) and it is determined whether each module designated for the current leakage test has been assessed (220). A negative response to the determination at step (220) is followed by a return to step (210), and a positive response is followed by a termination of the method. Accordingly, each module that did not fail the first test shown in FIG. 1 is tested for excessive current leakage.

As will be appreciated by one skilled in the art, aspects of the present embodiments may be embodied as a system, method or computer program product. Accordingly, aspects of the present embodiments may take the form of an entirely hardware based embodiment, an entirely software based embodiment (including firmware, resident software, microcode, etc.) or an embodiment combining software and hardware aspects that may all generally be referred to herein as a "circuit," "module" or "system." Furthermore, aspects of the present embodiments may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, RF, etc., or any suitable combination of the foregoing.

Computer program code for carrying out operations for aspects of the present embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present embodiments are described above with reference to flowchart illustrations and/or block diagrams of methods, apparatus (systems) and computer program products according to the embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 3:
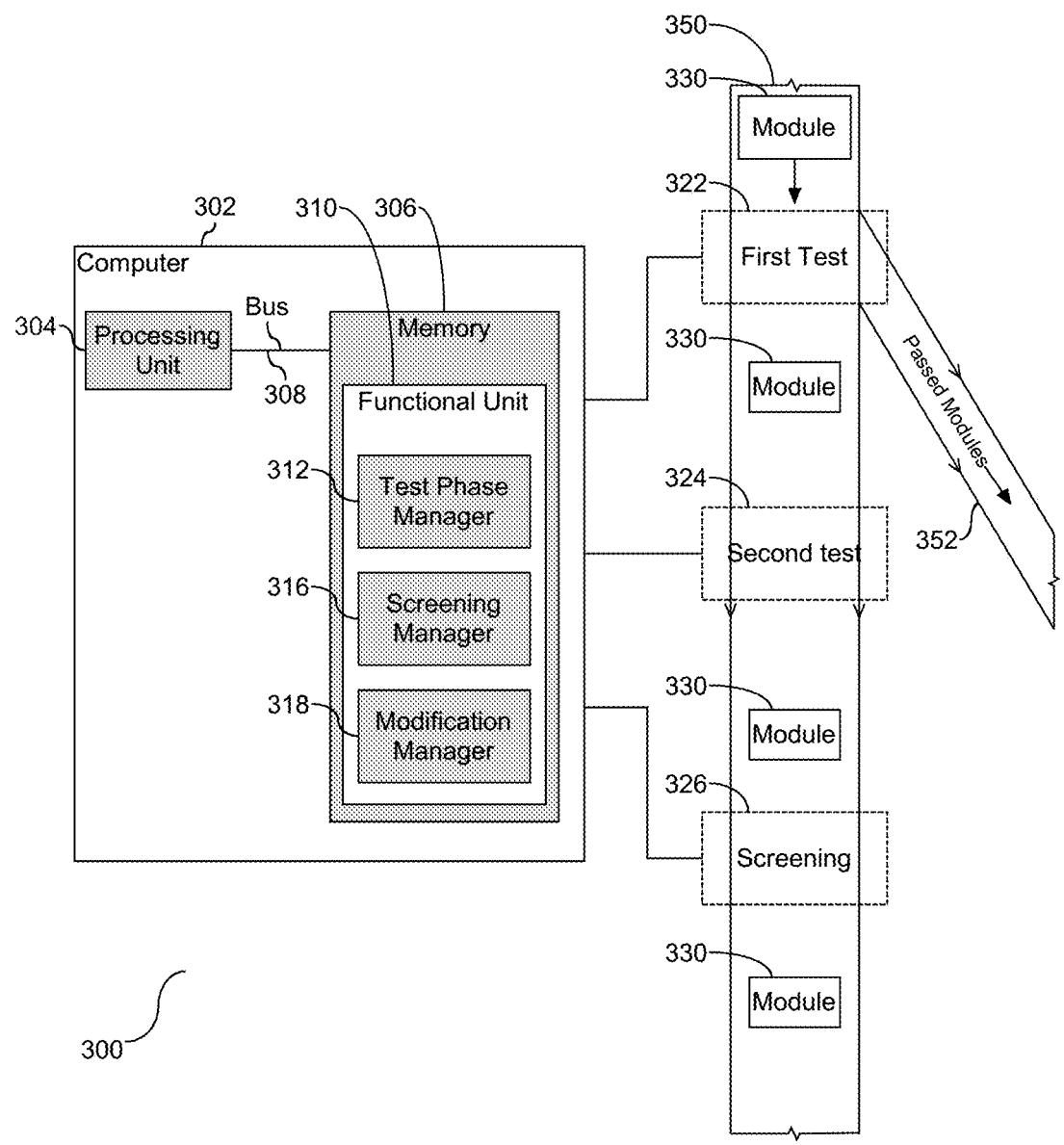
FIG. 3 depicts a block diagram of a system for electronic module quality assurance testing.

A system is also provided for implementing the electronic module testing method as described above. FIG. 3 is a block diagram (300) illustrating a system for module testing. A computer is provided (302) having a processing unit (304) in communication with memory (306) across a bus (308). A functional unit (310) is provided in communication with memory (306) having tools for implementation of module testing. The tools provided include, but are not limited to: a test manager (312), a screening manager (316), and in one embodiment a modification manager (318). Accordingly, a computer is provided with a functional unit having tools for the automation of module testing.

As the electronic module(s) (330) advance through a testing location (350), a first test (322) is performed on the electronic module(s) to determine if the electronic module(s) (330) experience any gross failure. The first test (322), as implemented by the test manager (312), assesses a batch of modules for any significant or gross defects, such as shorting. Modules determined to have passed the first test (322) are redirected to a location (352) for shipment away from the testing location (350). The test manager (312) performs a failure rate analysis for the modules subject to the first test (322). If the failure rate does not exceed a threshold, e.g. the modules passed the initial assessment; the modules subject to the first test (322) passed the first test (322) in the module assessment process. In one embodiment, the passed modules may be designated for shipment. Accordingly, the test manager (312) assesses an initial disposition of the modules.

However, if the test manager (312) assesses a failure rate based on the threshold assessment, then there is a detected defect within at least one or more tested modules. In one embodiment, identification of a defect is an indication of a high occurrence of a short or shorting defect. One such possible defect is a wire sweep. A second test (324) in the form of an x-ray wire sweep is performed on one or more of the failed modules from the first test (324). From this testing, it is determined if the module has a wire sweep deficiency. In one embodiment, the test manager (312) manages the x-ray of the failed modules. The test manager (312) assesses if a percentage of modules with a wire sweep is greater than a defined threshold. This threshold analysis provides an indicator as to which modules additional analysis should be carried out.

A screening manager (316) is provided in communication with the first test manager (312) and performs an electronic current leakage screening (326) for modules that passed the first test (322), and in one embodiment, the current leakage screening test is performed on modules that passed the wire sweep assessment and have been determined not to contain a wire sweep defect. In one embodiment, the modification manager (318) is provided in communication with the screening manager (316). The modification manager (318) establishes an electric current leakage setting for the screening manager (316). In one embodiment, the modification manager (318) modifies the current leakage setting, including a reduced leakage setting or an increased leakage setting. In one embodiment, the select grouping module(s) are tested twice by the screening manager (316), wherein the second time the module(s) are tested, the current leakage setting on the module(s) is adjusted by the modification manager (318). The screening manager (316) may individually eliminate modules that have failed the current leakage screening. In one embodiment, the screening manager (316) may replace the wire sweep from a population of non-failed modules with the screening for current leakage. Accordingly, the screening manager (316) performs a current leakage screening test, and the modification manager (318) sets and/or adjusts the electric current leakage setting to further assess current leakage in the select grouping of modules.

Figure 4:
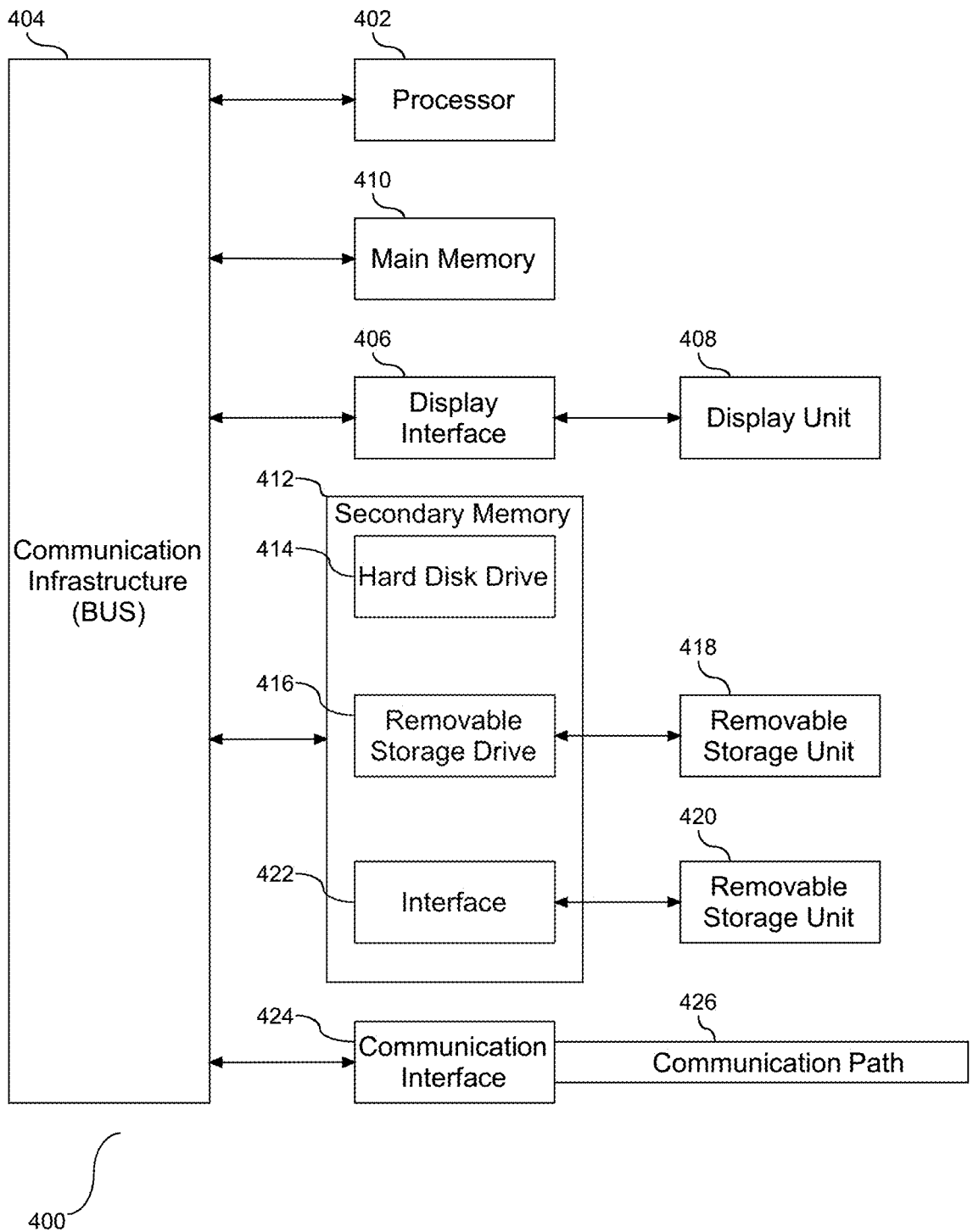
FIG. 4 depicts a block diagram showing a system for implementing an embodiment.

Referring now to the block diagram of FIG. 4, additional details are now described with respect to implementing at least one of the embodiments. The computer system includes one or more processors, such as a processor (402). The processor (402) is connected to a communication infrastructure (404) (e.g., a communications bus, cross-over bar, or network).

The computer system can include a display interface (406) that forwards graphics, text, and other data from the communication infrastructure (404) (or from a frame buffer not shown) for display on a display unit (408). The computer system also includes a main memory (410), preferably random access memory (RAM), and may also include a secondary memory (412). The secondary memory (412) may include, for example, a hard disk drive (414) and/or a removable storage drive (416), representing, for example, a floppy disk drive, a magnetic tape drive, or an optical disk drive. The removable storage drive (416) reads from and/or writes to a removable storage unit (418) in a manner well known to those having ordinary skill in the art. Removable storage unit (418) represents, for example, a floppy disk, a compact disc, a magnetic tape, or an optical disk, etc., which is read by and written to a removable storage drive (416). As will be appreciated, the removable storage unit (418) includes a computer readable medium having stored therein computer software and/or data.

In alternative embodiments, the secondary memory (412) may include other similar means for allowing computer programs or other instructions to be loaded into the computer system. Such means may include, for example, a removable storage unit (420) and an interface (422). Examples of such means may include a program package and package interface (such as that found in video game devices), a removable memory chip (such as an EPROM, or PROM) and associated socket, and other removable storage units (420) and interfaces (422) which allow software and data to be transferred from the removable storage unit (420) to the computer system.

The computer system may also include a communications interface (424). A communications interface (424) allows software and data to be transferred between the computer system and external devices. Examples of a communication interface (424) may include a modem, a network interface (such as an Ethernet card), a communications port, or a PCMCIA slot and card, etc. Software and data transferred via a communication interface (424) is in the form of signals which may be, for example, electronic, electromagnetic, optical, or another signal capable of being received by communications interface (424). These signals are provided to communications interface (424) via a communications path (i.e., channel) (426). This communications path (426) carries signals and may be implemented using wire or cable, fiber optics, a phone line, a cellular phone link, a radio frequency (RF) link, and/or other communication channels.

In this document, the terms "computer program medium," "computer usable medium," and "computer readable medium" are used to generally refer to media such as main memory (410) and secondary memory (412), removable storage drive (416), and a hard disk installed in a hard disk drive (414).

Computer programs (also called computer control logic) are stored in main memory (410) and/or secondary memory (412). Computer programs may also be received via a communication interface (424). Such computer programs, when run, enable the computer system to perform the features of the present embodiments as discussed herein. In particular, the computer programs, when run, enable the processor (402) to perform the features of the computer system. Accordingly, such computer programs represent controllers of the computer system.

The flowchart(s) and block diagrams in the Figures illustrate the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed.

Many modifications and variations will be apparent to those of ordinary skill in the art without departing from the scope and spirit of the embodiments. The embodiment was chosen and described in order to best explain the principles of the embodiments and the practical application, and to enable others of ordinary skill in the art to understand the embodiments with various modifications as are suited to the particular use contemplated.

It will be appreciated that, although specific embodiments have been described herein for purposes of illustration, various modifications may be made without departing from the spirit and scope of the embodiments. Accordingly, the scope of protection of the embodiments is limited only by the following claims and their equivalents.

What is claimed is:

1. A method for quality control review of one or more electronic modules comprising:
   performing a first test on a first batch of modules at a first location to detect a gross failure associated with the modules, wherein each module includes a functional assembly of electronic components, and re-directing modules determined to have passed the first test from the first location to a second location without further testing;
   performing a second test on failed modules of the first test, wherein the second test is an electromagnetic imaging test of one or more wires in the electronic module; and
   performing a third test on modules that pass the second test, the third test comprising an electronic current leakage screening comprising:
      performing a first instance of the third test on a module with a first current leakage setting; and
      performing a second instance of the third test on the module with a second current leakage setting different from the first current leakage setting.

2. The method of claim 1, wherein failure of the second test indicates a wire sweep failure.

3. The method of claim 1, wherein the electromagnetic imaging test is an x-ray wire sweep test.

4. The method of claim 2, wherein the wire sweep failure is a misalignment of one or more wires in the module.

5. The method of claim 1, wherein the current leakage test employs a current leakage limit.

6. The method of claim 1, further comprising adjusting a setting of the current leakage with an increased leakage setting.

7. The method of claim 2, further comprising replacing a module with a wire sweep failure with a replacement module selected from a population of modules that have not failed the screening for electronic current leakage.

8. A computer program product for performing quality control review of one or more electronic modules, the computer program product comprising a computer readable hardware storage device having computer readable program code embodied therewith, the computer readable program code when executed by a processor causing a system to:
   perform a first test on a first batch of modules at a first location to detect a gross failure associated with the modules, wherein each module includes a functional assembly of electronic components, and re-direct modules determined to have passed the first test from the first location to a second location without further testing;
   perform a second test on failed modules of the first test, wherein the second test is an electromagnetic imaging test of one or more wires in the electronic module; and
   perform a third test on modules that pass the second test, the third test comprising an electronic current leakage screening, the third test comprising:
      a first instance of the third test performed on a module with a first current leakage setting; and
      a second instance of the third test performed on the module with a second current leakage setting different from the first current leakage setting.

9. The computer program product of claim 8, wherein failure of the second test indicates a wire sweep failure.

10. The computer program product of claim 8, wherein the electromagnetic imaging test is an x-ray wire sweep test.

11. The computer program product of claim 9, wherein the wire sweep failure is a misalignment of one or more wires in the module.

12. The computer program product of claim 8, wherein the current leakage test employs a current leakage limit.

13. The computer program product of claim 8, further comprising computer readable program code when executed by a processor causing a system to adjust a setting of the current leakage with an increased leakage setting.

14. The computer program product of claim 9, further comprising computer readable program code when executed by a processor causing a system to replace a module with a wire sweep failure with a replacement module selected from a population of modules that have not failed the screening for electronic current leakage.

15. A system for performing quality control review of one or more electronic modules comprising:
   a processing unit in communication with memory;
   tools to perform quality control review for one or more electronic modules in a batch, wherein each module includes a functional assembly of electronic components, the tools comprising:
      a test manager to:
         perform a first test on a first batch of modules at a first location to detect a gross failure associated with the modules, wherein each module includes a functional assembly of electronic components, and re-directing modules determined to have passed the first test from the first location to a second location without further testing; and
         perform a second test on failed modules of the first test, wherein the second test is an electromagnetic imaging test of one or more wires in the electronic module; and
      a screening manager to perform a third test on modules that pass the second test, the third test comprising an electronic current leakage screening comprising:
         a first instance of the third test to be performed on a module with a first current leakage setting; and
         a second instance of the third test to be performed on the module with a second current leakage setting different from the first current leakage setting.

16. The system of claim 15, wherein failure of the second test indicates a wire sweep failure.

17. The system of claim 16, wherein the wire sweep failure is a misalignment of one or more wires in the module.

18. The system of claim 15, wherein the current leakage test employs a current leakage limit.

19. The system of claim 15, further comprising the screening manager to adjust a setting of the current leakage with an increased leakage setting.

20. The system of claim 16, further comprising the screening manager to replace a module with a wire sweep failure with a replacement module selected from a population of modules that have not failed the screening for electronic current leakage.

* * * * *